METHOD OF MAKING PRINTED CIRCUIT

Filed Aug. 3, 1955 2 Sheets-Sheet 1

Inventors:
Stanislaw J. Szpak,
Bernard Darrel,
by [signature]
Their Attorney.

Oct. 27, 1959 S. J. SZPAK ET AL 2,910,351

METHOD OF MAKING PRINTED CIRCUIT

Filed Aug. 3, 1955 2 Sheets-Sheet 2

Inventors:
Stanislaw J. Szpak,
Bernard Darrel,
by [signature]
Their Attorney.

2,910,351

METHOD OF MAKING PRINTED CIRCUIT

Stanislaw J. Szpak and Bernard Darrel, Burlington, Vt., assignors to General Electric Company, a corporation of New York Application August 3, 1955, Serial No. 526,162

7 Claims. (Cl. 41—43)

Figures 1, 2, 3, 4, 5, 6:
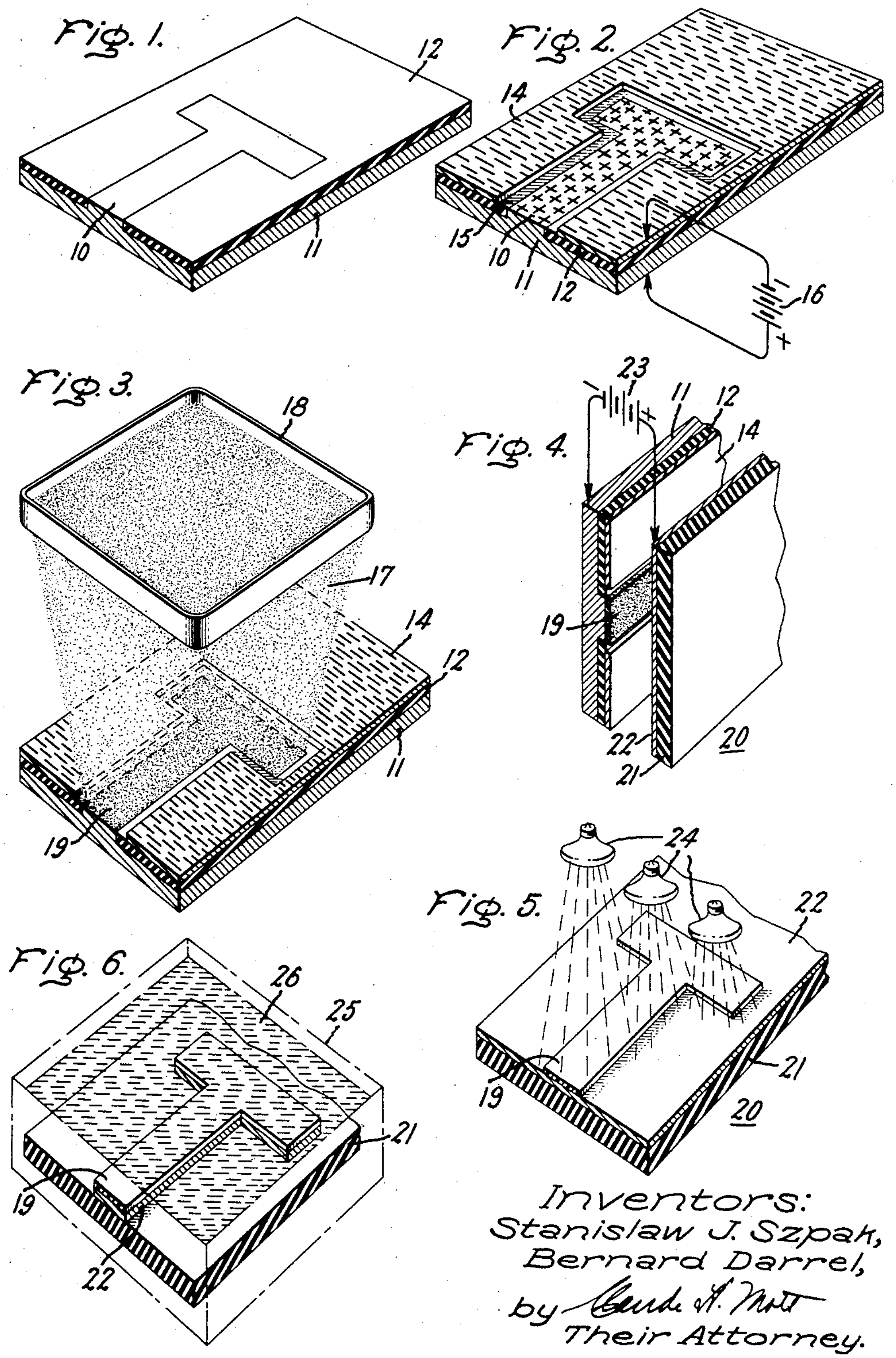

This invention generally relates to electrical circuit fabrication, and more particularly to processes for making a prefabricated electrical conducting circuit, commonly termed a "printed circuit."

In a prior application of Stanislaw J. Szpak, Serial No. 479,622, filed January 3, 1955, there is disclosed an electrostatic process for fabricating a "printed circuit," wherein the desired printed circuit pattern is initially projected by a light beam to form a latent or invisible image on a layer of charged photoconductive insulating material covering one surface of a chassis base. A visible image of dust is then electrostatically "developed" from this latent image; and thereafter the chassis is treated to form the desired printed circuit pattern from this developed dust image.

In accordance with the present invention, a similar latent image or patern conforming to the designed "printed circuit" or the negative thereof is electrostatically formed over the surface of a specially prepared master chassis, and this latent image is again electrostatically "developed" or made visible by a dust image. However, rather than directly forming the desired printed circuit on this master chassis, this dust image is then transferred to a second chassis and this second chassis is thereafter treated to provide the desired printed circuit. Since the first specially prepared master chassis is not itself treated to permanently form the "printed circuit," it may be used over and over again in a manner somewhat analogous to repeated use of a photographic negative to produce numerous photographic prints.

In accordance with a second feature of the present invention, this latent image is formed by electrical means rather than by optical electrical means as in the prior application of Szpak.

It is accordingly an object of the present invention to provide a process for fabricating a given configuration of electrical conductors on a chassis that is both faster and less expensive than prior processes.

Other objects and many attendant advantages of this invention will be more readily comprehended by those skilled in this art upon a detailed consideration of the following specifications taken in connection with the accompanying drawing wherein:

Figs. 1–6, inclusive, are perspective views illustrating the various steps in performing one preferred embodiment of the present invention.

Figs. 7–13, inclusive, are perspective views illustrating the various steps in performing a second preferred embodiment of the invention.

Referring now to Figs. 1–6, inclusive, in sequence, for a brief summary of one process in accordance with the present invention, a master pattern in the desired printed circuit, generally designated 10, is preferably formed of conducting metal or the like by machining, etching or otherwise treating a conducting chassis board 11 to provide the conducting pattern 10 standing out in relief over the surface of the board 11. The removed portions of this conducting board 11 are then preferably replaced with a dielectric covering material 12 that is formed flush with the raised surface of the conducting pattern 10 and adhered to the board 11 to provide a level surface over the upper side of the composite master chassis.

To complete the master as shown by Fig. 2, a conductive layer 14 may then be applied over the upper surface of the dielectric covering portion 12, but separated from the conducting pattern 10 by a spacing 15 to prevent electrical conduction between the conducting pattern 10 and the conducting layer 14. Thus, the surface of the master board is provided with two electrically isolated conducting portions, one in the configuration of the desired printed circuit 10 and the second in the configuration of the negative or reverse of this circuit 14.

In the second operation shown by Fig. 2, a potential source 16 is applied between the conductive layer 14 and the desired printed pattern 10, with the pattern 10 receiving a positive potential and the conducting layer 14 receiving a negative potential, thereby forming a latent positively charged surface in the desired printed circuit pattern. Thus, by this procedure, an electrostatic pattern or electrostatic latent image corresponding to the desired printed circuit pattern is placed over the surface of the master board.

In the following step (Fig. 3), this charged surface of the master is sprinkled or otherwise covered with a fine dust, powder, wax, or the like 17 that is polarized in an electric field, from a suitable container 18 having a perforated screen or the like (not shown) at its lower opening. This powder adheres to the positively charged surface 10 by electrostatic attraction, thus forming a desired visible dust layer 19 over the master surface in the printed circuit pattern 10.

By means of the above steps, it is noted that all portions of the desired pattern on the surface of the master board are covered with the dust layer 19, but all other portions of the upper surface of the master board remain uncovered.

In the following step, as illustrated by Fig. 4, this dust pattern 19 is transferred to a chassis 20, preferably comprised of a non-conducting board 21 clad with a layer 22 of conducting material, such as copper. This transfer is perferably performed by placing the dust carrying surface 10 of the master in contact with the layer of copper 22 and applying a reversed or negative potential from a voltage source 23 to the conducting master chassis and the positive potential from this source 23 to the layer of copper 22. By negatively energizing the master, the dust image 19 is repelled from the surface of the master and attracted to the positively energized surface 22 of the chassis 20, as shown in Fig. 5.

This dust image 19 may then be affixed or more permanently and uniformly adhered to the conducting surface 22 of the chassis 20 by preferably heating the deposit of dust or wax by infra-red heat lamps 24 or the like, as shown in Fig. 5. This heat melts and blends the resinous dust or wax and adheres this material to the chassis surface, thereby more permanently affixing this image 19 to the chassis surface 22.

As illustrated by Fig. 6, this chassis 20 is then preferably treated by being placed in a vessel 25 containing a fluid 26 that dissolves the portions of the conducting layer 22 that are uncovered by the dust deposit pattern 19, while unaffecting the dust pattern 19 itself and the portion of the copper layer 22 under this dust deposit, thereby dissolving or etching away the exposed portion of the conducting layer of the chassis 20 and leaving the remaining portions of the conducting layer 22 in the desired printed circuit configuration underneath the dust image 19.

In the final step (not illustrated), the complete chassis may then be immersed in a second suitable dissolving agent that removes the dust pattern 19 while unaffecting the remaining portions of the conducting layer 22 affixed to the nonconducting board 21. By this final operation, the printed circuit is completed, since a conducting pattern in the desired printed circuit configuration remains over the surface of the nonconducting chassis board 21.

In summary, in accordance with this aspect of the present invention, a "capacitor" type master board is initially constructed having a portion of its surface 10 adapted to be positively charged in the desired printed wiring configuration and the remaining portion of its surface 14 charged negatively. A dust pattern 19 in the desired printed wiring configuration is then formed over this positively charged surface of the master by electro-statically adhering dust particles to only the positively charged portions; and this complete dust pattern is then transferred to cover identical portions of a metal clad chassis 20. In the final steps, the portions of the metal layer 22 of the chassis 20 uncovered by this dust image are first removed and then the protective dust pattern is removed, leaving the desired printed pattern formed in metal over the surface of the chassis. By means of this process, the master "capacitor" 11 may be used over and over again in the mass production of the desired printed circuit as desired.

*Modifications of the first embodiment*

The above steps illustrated by Figs. 1–6 yield a desired electrically-conducting printed pattern of metal or the like on the surface of a nonconducting chassis. However, in many applications of printed circuits, it is desirable to plate or cover this printed circuit pattern with gold, silver, lead-tin alloy or the like. To obtain this differently constructed printed pattern by means of the present invention, the above process may be varied by initially employing a master "capacitor," generally designated 27, Fig. 7, that is the negative or reverse of the master "capacitor," in the first embodiment. That is, this master 27 is preferably comprised of a conducting board 28 having material removed in the desired printed wiring configuration and a nonconducting material 29 substituted to provide a master with an upper surface having a nonconducting portion in the configuration of the desired printing 29, and the remaining portions of the surface 28 of conducting material.

Figures 7, 8, 9, 10, 11:
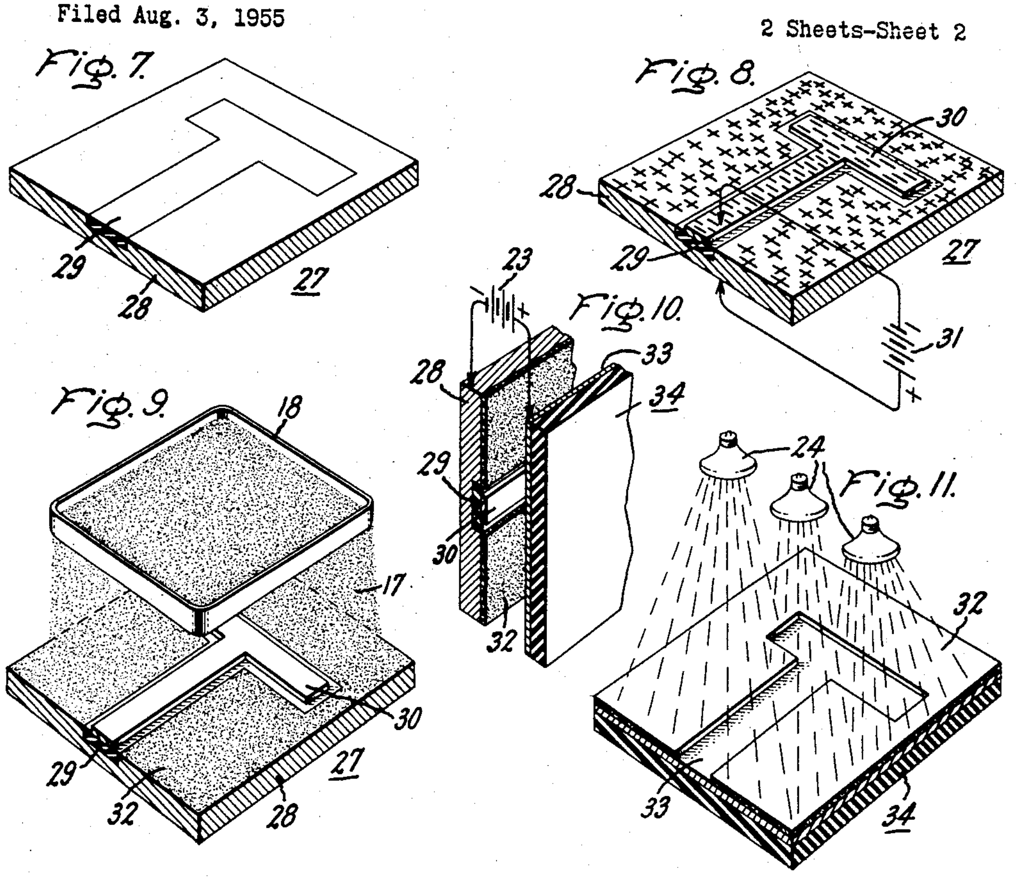

As illustrated by Fig. 8, the step of providing and spacing a layer of conducting material 30 over the nonconducting insert 29 to complete the master "capacitor" surface, and the charging of this capacitor by a suitable voltage source 31, is substantially the same as shown in Fig. 2, differing, however, in having the portion of the master "capacitor" surface corresponding to the desired printed wiring configuration 30 being negatively charged and the remaining portion of the surface of the master "capacitor" being positively charged.

Similarly, the steps of forming the dust image 32 over the positively charged surface portions of the master (Fig. 9), transferring this dust image 32 to a metal layer 33 clad over the upper surface of a nonconducting chassis member 34 (Fig. 10), and affixing this image 32, are similarly the same as shown in Figs. 3, 4 and 5 excepting for the fact that the dust image 32 formed on the master 27 and transferred to the chassis 34 is the negative of the desired printed wiring configuration rather than the positive as in the first embodiment.

Thus, by means of the second embodiment of this invention illustrated by Figs. 7–11, inclusive, all portions of the metal layer surface 33 of the chassis 34 are covered by the dust image 32, excepting for those portions in the desired printed surface configuration, and the portions of this metal clad surface in the desired circuit configuration are exposed, as best shown in Fig. 11.

Figure 13:
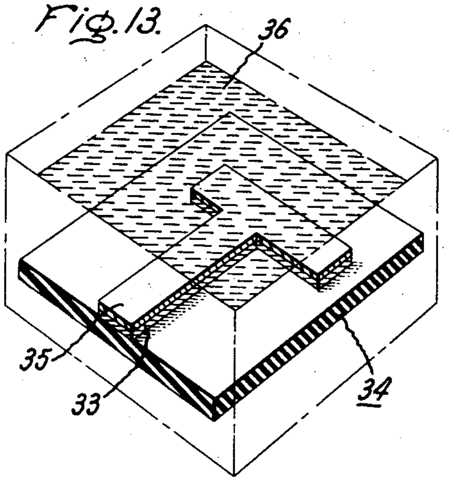
Figure 12:
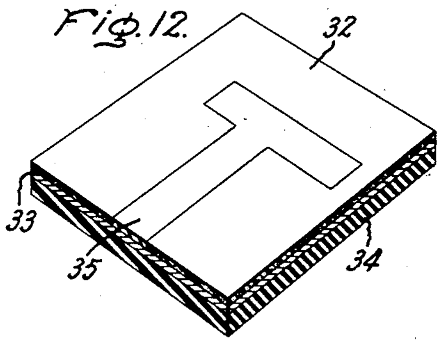

In the following step, as illustrated by Fig. 12, the portions of the metal layer 33 uncovered by the dust image 32 are then preferably plated by a suitable process or otherwise treated to deposit a desired plating layer 35 of gold, silver, lead-tin or the like, as desired; and in the remaining and final step of the process illustrated by Fig. 13, the chassis is preferably immersed in a suitable solvent 36 that dissolves the dust image 32 and the portions of the metal layer 33 thereunder, while unaffecting the plated circuit configuration of gold, silver, or the like 35, and the portions of the copper layer 33 thereunder.

*Detailed procedure*

Considering each of these steps in greater detail, the preferred materials employed therein, and the manner of performing these operations, the master "capacitor" shown by Figs. 1 and 7 may be preferably formed of a metal board of copper, zinc, iron or the like, that is accurately machined, etched, or otherwise treated to remove metal, leaving the desired printed circuit configuration (or its negative) standing out in relief. To the etched-away portions of this metal board may then be added a suitable dielectric material that covers the removed portions and that provides a planar surface. This dielectric material may be deposited or otherwise adhered to the board to fill the removed portions of the metal board, and then may be machined, ground, or filed preferably to provide an accurate planar surface for forming and transferring a precise dust image. Materials such as Hysol, Teflon, fluorinated hydrocarbons, or cellulose acetate, are examples of suitable dielectric materials that may be used and are readily machined or ground flush with the top of the raised portions of the metal board.

Since only the surface of the master "capacitor" is employed to obtain a charged pattern for forming and transferring a dust image, a more easily fabricated, and less expensive, master may also be made of a nonconducting board clad with a conducting layer of metal or the like. Portions of this metal layer in the form of the desired printed circuit pattern (or its negative) may then be easily removed by etching or machining to form a conducting pattern in the desired configuration standing out in relief over the surface of a nonconducting board. Depending upon the thickness of this master pattern, it may also be unnecessary to add a dielectric material for replacing the removed material or to cover this dielectric with a layer of paint 14. Masters made in this manner and comprised of a phenolic board 1/16 inch thick coated with a metal layer .003 inch thick have been used successfully and are considered preferable to their equivalents (shown by Figs. 2 and 8) for many applications.

The conductive layer (14, Fig. 2) applied to substantially cover the nonconducting surface portions (12, Fig. 1) of the master may be applied by painting or otherwise depositing a metallic paint of aluminum or other metal, or by spraying molten such as lead, tin, bismuth or the like, as desired.

The spacing (15, Fig. 2) between the metallic surface portions of the master and the applied conductive layer should be sufficient to prevent conduction or short-circuiting between the applied conducting layer and the metallic portions of the master when a potential is applied to form the desired positive and negative charged patterns on its surface. It is preferred to space the edges of this conducting paint a sufficient distance from the metallic portions to withstand potentials of the order of several thousand volts needed to form the sufficiently large electrostatic charge density over the "master" surface. A spacing of approximately 1/16 inch between the conducting paint and the metallic board, to withstand a potential in the order of 2,000 volts, has been found desirable for providing an adequate electrical charge over the surface of the master to retain the dust particles.

The dusting material employed to form the transferrable dust image may be any one of the group of dielectric substances, such as waxes and resins of natural origin, or plastic powders, all preferably of low melting point and having the property of being easily charged in electric fields, and thereby attracted to either a positively or negatively charged surface. In the embodiment of Figs. 1–6, this material should also be non-soluble in the etching fluid that dissolves the portions of the conducting layer of the chassis (such as copper). On the other hand, this material should also preferably be soluble in a suitable dissolving agent that does not affect this conducting layer; for in the final step of the first embodiment (not shown), this protective covering of dust is removed to expose the conducting printed pattern underneath. Among the various materials having the above characteristics, the pulverized resins including gum copal, sandarox, resin, sealing wax, and in particular gum arabic, have been found suitable.

It may sometimes be advantageous to employ a dust in which the individual granules are generally spherically shaped, since this appears to contribute a more accurate distribution of the dust over the electric charge. The various resins or waxes can be made into a spherical powder by spraying the molten resin or wax from an atomizer into a cold chamber into which spherical droplets will harden before coming into contact with other particles. Another method is to sprinkle the pulverized resin or wax through a heated zone where the particles momentarily melt and assume a rounded form and then harden (not shown).

If this powdered material is too finely divided, it has the disadvantage of adhering to all surfaces including those having the opposite charge. To prevent this, the powder may be mixed with small beads of common glass, amber or the like, preferably of small size having a diameter of .015" to .020". The adhesive force of the dust particles to the glass beads should be equal to or greater than the force between this powder and the uncharged or negatively charged portions of the master. As the particles are applied over the charged portions, the electrostatic force between the dust and the master is greater than the adhesive force between the glass beads and the dust and results in an accumulation of the dust and glass on the positively charged sections of the master.

After applying the dust, the dusted master may then be subjected to a general draft of air by blowing the breath upon it or directing the air from a nozzle of a suitable blower (not shown) against its surface to blow off all loose dust not held on the surface by electrostatic attraction. In some instances the dusting and blowing off of the loose particles may be performed in one step, by blowing the dust against the charged surface with a draft of air from a dust atomizer or other blower device. In some instances the dust itself may be given an electrostatic charge by friction or by discharging electricity through it, the polarity of the charge preferably being opposite to that of the electrostatic charge on the desired portions of the master.

The chassis for receiving the dust image from the master and for finally yielding the desired printed circuit configuration may be comprised of a nonconducting plate or board of phenolic composition or the like provided with a conducting layer of metal such as copper or tin alloy. Other bases and conducting layers may, of course, be employed as well known to those skilled in the art.

To transfer the dust image on the master to this chassis, it is preferred to bring the surface of the master carrying the dust image into physical contact with the conducting layer of the chassis and invert the master and chassis to a horizontal position, with the master overlying the chassis. An electric field is then applied between the conducting layer of the chassis and the conducting portions of the master carrying the dust image; and this electric field is reversed from the field which originally adhered the dust image to the master. By reversing this electric field and by providing a sufficiently strong reversed field, the particles of the dust pattern are repelled from the surface of the master and attracted in the same pattern to the conducting surface of the chassis.

This transferred dust image may then be more permanently affixed to the chassis in any one of a numer of several ways, depending upon the type of dust used and the composition of the conducting layer of the chassis. If wax or other soft and sticky materials are employed, the dust will in some cases be sufficiently adhered by pressure of the contact of the master against the chassis to produce a sufficiently permanent attachment. If a resin or wax dust is employed having a low melting point, the chassis may be heated momentarily to a temperature melting the resin or wax, thereby adhering this material more permanently and uniformly to the conducting layer of the chassis. This heating may also be accomplished by heat radiating electrical resistance elements, or as shown by Fig. 5, by infra-red lamps. This dust pattern may also be solidified, hardened, and fused by being baked in an oven or, alternatively, being brought in the presence of a saturated solvent vapor, which blends the particles of the dust together and adheres them to the surface of the chassis.

For removing the portions of the chassis conducting surface uncovered by the dust image (such as shown in Fig. 6), any one of a number of solvents or acids may be employed that dissolves the exposed conducting layer of the chassis but does not act upon the solidified dust image. Various acids, such as sulfuric acid, chromic acid, or nitric acid do not dissolve a number of the various resins, waxes, or plastics that may be employed to dust the board, and are therefore suitable for this purpose. These acids, however, do dissolve or remove the portions of the exposed or uncovered conducting layer of copper or the like on the surface of the chassis, thereby removing all of this material in the configuration of the desired printed pattern and exposing the portions of the nonconducting chassis plate underneath.

In the final step of the first embodiment (not shown), the dust covering image is preferably removed, leaving the remaining conducting surface of the chassis in the form of the desired printed circuit pattern. For this purpose, a solvent may be employed that dissolves the dust material while unaffecting the remaining portions of the conducting layer of the chassis. If the dust image deposit is of wax, various ones of the chlorinated hydrocarbons or kerosene or gasoline may be employed. However, depending upon the composition of the dust employed, and that of the conducting layer of the chassis, other solvents may, of course, be used for this purpose with equally good results.

*Details of the second embodiment (Figs. 7–12)*

In accordance with the second preferred embodiment of the invention, the visible dust image formed on the chassis (as shown by Fig. 11), is a negative image of the desired printed circuit wiring, and covers all conducting portions of the upper surface of the chassis excepting those portions 33 in the desired printed circuit configuration which remain exposed. Thereafter, a metallic deposit is added to complete or fill up the voids in the form of the desired printed circuit pattern, and this metallic deposit may be added by filling this voided area with molten solder, lead, or the like; or by electroplating or otherwise plating the exposed portions of the conducting chassis surface with any one of a number of metals such as silver, lead, tin and alloy, or the like. The nonconducting dust layer negative image, covering all remaining upper surface portions of the conducting chassis surface, prevents the disposition of this metallic material on any portions of the chassis surface other than those formed in the desired image. Care should be observed, however, to select a dust deposit that does not deleteriously react with any of the electroplating fluids, or otherwise portions of the resinous dust might be dissolved in such fluids and the metal deposited on other portions of the chassis surface.

If materials such as solder, lead, or the like are added in their molten form, or if this conducting chassis surface is plated with silver or other metal, the dust image material may be the same as that discussed above.

Thereafter, as shown in Fig. 12, the new chassis surface formed of the dust image and the deposited material may then be ground, machined, filed, or otherwise treated to provide the uniformity of the desired conducting pattern that is needed. In the remaining step, as illustrated by Fig. 13, both the dust image and the portions of the conducting chassis layer underneath this dust image are removed together, leaving the desired printed pattern configuration formed of two layers, the under-layer 33 being the remaining portion of the original conducting surface of the chassis and the upper layer 35 being the plating of lead and alloy or the like.

For removing both the dust and conducting layer 33 together, any one of a number of various solvents such as acids may be employed that will dissolve both the dust material and the copper or other plating, while unaffecting the more inert added conducting material, such as silver or lead.

*Variation of the first embodiment of the invention*

As an alternative to the second embodiment of the invention that may be employed, if it is desired to add a plated surface of gold, silver, or lead-tin over the desired printed wiring configuration, the first preferred process of the invention may be followed as shown by Figs. 1–5, inclusive, with the following changes:

The dust material adhered to the charged portions of the master may be comprised of not only the nonconducting dielectric material mixed with glass beads, but in addition with a silver compound mixed in with the dusting powder. The following step of this process (Fig. 4) may then be followed, wherein this new dust composition containing the silver compound is transferred to a conducting layer of a nonconducting chassis board and fused to this chassis board in the same manner as shown by Fig. 5. As in Fig. 6, the uncovered portions of this conducting layer may then be removed.

In the following step, the board is preferably immersed in a suitable solution for reducing the silver compound to metallic silver, thereby providing a conducting dust deposit of silver in the desired circuit pattern configuration over a nonconducting board. The board may then be electroplated or otherwise treated to deposit gold, silver or the like over this conducting pattern, thereby yielding the desired printed circuit configuration formed of a nonconducting board with the upper circuit pattern comprised of a layer of the desired plating material.

*Conclusion*

For purposes of clearly illustrating the present invention, each of the process steps have been shown as separate and distinct operations that may be performed by hand. However, it is contemplated that many of these operations may be combined, and all of these operations mechanized to enable a rapid and inexpensive mass production or assembly line fabrication of these printed circuits. For example, in the first embodiment, the master may be electromechanically or electrically charged by a voltage potential, and thereafter may be automatically processed through a spraying device where it is sprinkled with a suitable covering powder. A chassis may then be brought into contact with this master and the desired dust pattern transferred to the surface of the chassis and the powder hardened to form a more permanent covering. This chassis may then be passed along on an assembly line and through two dissolving baths, the first bath removing the portions of the conducting material uncovered by the hardened dust image, and the second removing the dust image to yield the desired printed wiring underneath the surface of the non-conducting board.

In a similar manner, the operation of the second preferred process and the discussed variation in this same process may also be mechanized and made automatic for rapidly and inexpensively printing and fabricating printed circuits.

Furthermore, either of the above processes or modifications thereof may be used to produce positive or negative dust pattern images on the master; for by reversing the polarity across the various portions of the master "capacitor," either a positive or a negative charge pattern and dust image may be formed.

Since these and many other variations may be made, both in the individual steps and in the combination of these steps in carrying out the present invention in accordance with the teaching herein, it is intended that this invention is to be limited only in accordance with the following claims appended hereto.

What we claim as new and desire to secure by Letters Patent of the United States is:

1. The method of making a printed circuit comprising the steps of: providing a master comprising a capacitor having its surface divided into two electrically isolated metallic conducting portions, one in the configuration of the desired printed circuit pattern, and the second covering substantially all the remaining portion of the surface, applying a voltage source across said two portions to oppositely charge said surfaces with an electrostatic potential, dusting said surfaces with a fine thermoplastic dielectric powder having an affinity for one polarity of said charge thereby producing a powder design that adheres to and covers one of said surface portions, transferring said powder design in the same pattern to the upper layer of a board having a base of electrically non-conducting material and an upper layer of electrically conducting material by placing said capacitor surface and powder design in contact with said upper layer and applying a potential of polarity opposite to said one polarity at said capacitor surface portion carrying the powder design and said upper layer, affixing said powder design to said upper surface to form a protective coating, and etching away the uncoated surface portions of said upper conducting layer to produce a printed circuit configuration underneath said protective coating.

2. The method of making a printed circuit comprising the steps of: providing a master comprising a capacitor having its surface divided into two electrically isolated metallic conducting portions, one in the configuration of the desired printed circuit pattern and the second covering substantially all remaining portions of the surface, applying a voltage source across said portions to oppositely charge such surfaces with an electrostatic potential, dusting said surfaces with a fine thermoplastic dielectric powder having an affinity for one polarity of said charge thereby producing a powder design that adheres to and covers one of said surface portions, transferring said powder design in the same pattern to the upper layer of a board having a base of electrically non-conducting material and an upper layer of electrically conducting material to form a protective coating of powder over the upper layer in the same pattern, and etching away the uncoated surface portions of the upper conducting layer to form the desired printed circuit configuration.

3. The method of making a printed circuit comprising the steps of: providing a master comprising a capacitor having its surface divided into two electrically isolated metallically conducting portions, one in the configuration of the desired printed circuit pattern, and the second covering substantially all the remaining portion of the surface, applying a voltage source across said portions to oppositely charge said surfaces with an electrostatic potential, dusting said surfaces with a fine thermoplastic dielectric powder having an affinity for one polarity of said charge thereby producing a powder design that adheres to and covers one of said surface portions, transferring said powder design in the same pattern to the upper layer of a board having a base of electrically nonconducting material and an upper layer of electrically conducting material by placing said capacitor surface and powder design in contact with said upper layer and applying a potential of opposite polarity across the capacitor surface portion carrying the powder design and said upper layer, exposing said board to a solvent that dissolves the portions of the upper layer uncovered by the powder design, and exposing said board to a second solvent that removes said powder design.

4. The method of making a printed circuit comprising the steps of: providing a master comprising a capacitor having its surface divided into two electrically isolated metallically conducting portions, one in the configuration of the desired printed circuit pattern, and the second covering substantially all the remaining portions of the capacitor surface, applying a voltage source across said portions to oppositely charge such surfaces with an electrostatic potential, dusting said surfaces with a fine thermoplastic dielectric powder having an affinity for one polarity of said charge thereby producing a powder design that adheres to and covers one of said surface portions, transferring said powder design in the same pattern to the upper layer of a board having a base of electrically nonconducting material and an upper layer of electrically conducting material by placing said capacitor surface and powder design in contact with said upper layer and applying a potential of opposite polarity across said capacitor surface portion carrying the powder design and said upper layer, applying a second electrically conducting material to the exposed portions of said upper layer uncovered by said powder design, and exposing said board to a solvent for removing said powder design and the portions of the upper layer of conducting material thereunder without affecting the applied second conducting material and the portions of the upper layer of conducting material thereunder.

5. The method of making a printed circuit comprising the steps of: providing a master comprising a capacitor having its surface divided into two electrically isolated metallically conducting portions, one in the configuration of the desired circuit pattern, and the second covering substantially all the remaining parts of the surface, applying a voltage source across said two portions to oppositely charge such portions with an electrostatic potential, dusting said surface with a fine thermoplastic dielectric powder having an affinity for one polarity of said charge and containing a metallic compound which is reducible to metal thereby producing a powder design that adheres to and covers one of said surface portions, transferring said powder design in the same pattern to an electrically nonconducting board by placing said capacitor surface and powder design in contact with the surface of said board and discharging said capacitor surface, and immersing said board in a solution for reducing said metallic compound in the powder to metal thereby providing a conducting powder deposit of metal in the desired circuit pattern configuration on a nonconducting board.

6. The method of making a printed circuit comprising the steps of: providing a master comprising a capacitor having its surface divided into two electrically isolated metallically conducting portions, one defining the boundaries of the desired printed circuit pattern, electrostatically charging said portions with respect to one another, dusting said surface with a fine thermoplastic dielectric powder having an affinity for a given polarity charge thereby producing a powder deposit that adheres to and covers said surface of said one portion in a predetermined pattern, transferring said powder deposit in the same pattern to the upper layer of a board having a base of electrically nonconducting material and an upper layer of electrically conducting material by placing said surface of said master bearing the powder design in contact with said upper layer and discharging said electrostatic charge, applying a second electrically conducting material to the exposed portions of said upper layer uncovered by the powder deposit, and exposing said board to a solvent for removing said powder deposit and the portions of the upper layer thereunder without affecting said second conducting material and the portions of the upper layer under the second conducting material.

7. The method of making a printed circuit comprising the steps of: providing a master comprising a capacitor having its surface divided into two electrically isolated metallically conducting portions, one in the configuration of the desired printed circuit pattern, electrostatically charging said portions with respect to one another, dusting said surface with a fine electrically nonconducting powder containing a metallic compound which is reducible to metal mixed with dielectric powder material and having an affinity for said electrostatic charge thereby producing a powder design that adheres to and covers said one portion of the surface of the matter in said predetermined pattern, transferring said powder design in the same pattern to the surface of an electrically nonconducting board by placing the surface of the master carrying the powder design in contact with the surface of said board and discharging the electrostatic charge on said member, and immersing said board in a liquid for reducing the metallic compound to metal thereby providing a conducting powder deposit of metal in the predetermined pattern on the upper surface of a nonconducting board.

References Cited in the file of this patent

UNITED STATES PATENTS

| | | |
|---|---|---|
| 2,277,013 | Carlson | Mar. 17, 1942 |
| 2,297,691 | Carlson | Oct. 6, 1942 |
| 2,447,541 | Sabee et al. | Aug. 24, 1948 |
| 2,474,988 | Sargrove | July 5, 1949 |
| 2,602,731 | Nierenberg | July 8, 1952 |
| 2,626,206 | Adler et al. | Jan. 20, 1953 |
| 2,637,651 | Copley | May 5, 1953 |
| 2,647,464 | Ebert | Aug. 4, 1953 |
| 2,735,785 | Greig | Feb. 21, 1956 |
| 2,762,726 | Saunders | Sept. 11, 1956 |